US012332377B2

(12) United States Patent
Xu et al.

(10) Patent No.: US 12,332,377 B2
(45) Date of Patent: Jun. 17, 2025

(54) METHOD, SYSTEM AND APPARATUS FOR CORRECTING SATELLITE OBSERVATION DATA (71) Applicant: CHINESE ACADEMY OF METEOROLOGICAL SCIENCES, Beijing (CN)

(72) Inventors: Xiangde Xu, Beijing (CN); Yi Wang, Beijing (CN); Le Wang, Beijing (CN); Ruixia Liu, Beijing (CN); Runze Zhao, Beijing (CN); Weihao Gu, Beijing (CN); Duanyang Liu, Beijing (CN); Shengjun Zhang, Beijing (CN); Wenyue Cai, Beijing (CN); Haiduo Sun, Beijing (CN); Kai Zhang, Beijing (CN); Jun Hou, Beijing (CN)

(73) Assignee: CHINESE ACADEMY OF METEOROLOGICAL SCIENCES, Beijing (CN)

( * ) Notice: Subject to any disclaimer, the term of this patent is extended or adjusted under 35 U.S.C. 154(b) by 0 days.

(21) Appl. No.: 18/397,539

(22) Filed: Dec. 27, 2023

(65) Prior Publication Data

US 2025/0067840 A1 Feb. 27, 2025

(30) Foreign Application Priority Data

Aug. 25, 2023 (CN) .......................... 202311080797.6

(51) Int. Cl.
*G01S 7/40* (2006.01)
*G01S 13/58* (2006.01)
(52) U.S. Cl.
CPC ................ *G01S 7/40* (2013.01); *G01S 13/58* (2013.01)

(58) Field of Classification Search
CPC . G01S 7/40; G01S 13/58; G01S 13/95; G01S 7/417; G01S 13/9094; Y02A 90/10;
(Continued)

(56) References Cited

U.S. PATENT DOCUMENTS 6,067,852 A * 5/2000 Alber ...................... G01S 19/07
73/178 R
2014/0212061 A1 * 7/2014 Miller ..................... G01W 1/00
382/275

FOREIGN PATENT DOCUMENTS

CN 110716185 A 1/2020
CN 115329273 A 11/2022

OTHER PUBLICATIONS

Notice of Grant from corresponding Chinese Patent Application No. 202311080797.6, mailing date Jul. 2, 2024.
(Continued)

*Primary Examiner* — Olumide Ajibade Akonai
(74) *Attorney, Agent, or Firm* — GRUMBLES LAW PLLC; Brittany Haanan (57) ABSTRACT The present disclosure provides a method, system and apparatus for correcting satellite observation data. By acquiring microwave radiometer (MWR) movement observation data of a radiosonde observation limited sounding area, correcting the MWR movement observation data based on corresponding radiosonde observation data, and correcting satellite observation data based on the radiosonde observation data and corrected MWR movement observation data, the present disclosure corrects the satellite observation data of the radiosonde observation limited detection area, reduces an error of the satellite observation data, and makes the satellite observation data more accurate. The present disclosure realizes networked observation on vertical sounding of the radiosonde observation limited area, changes a limited observation condition of radiosonde observation
(Continued)

only available at 08:00 and 20:00 every day in the original service system, and acquires complete high spatio-temporal resolution vertical sounding data of the radiosonde observation limited area in daytime.

2 Claims, 5 Drawing Sheets

(58) Field of Classification Search
CPC ......... G06N 20/00; G06F 30/27; G06F 17/10; G06F 30/20; G01J 5/00; G01J 5/80; G06T 2207/10032; G06T 2207/30192; G06V 20/13; G06V 10/82; G01N 2021/3531; G01W 1/08
See application file for complete search history.

(56) References Cited

OTHER PUBLICATIONS

Office Action pertaining to corresponding Chinese Patent Application No. 202311080797.6, mailed Apr. 15, 2024.
Office Action pertaining to corresponding Chinese Patent Application No. 202311080797.6, mailed Feb. 1, 2024.
Xiaonong, G., "Quantitative precipitation estimation technique based on multiple remote sensing platform (radar, satellite) data and rain gauge data", Master's Thesis, Chinese Academy of Meteorological Sciences, Mar. 2010.
Yonghui et al., "Numerical Simulation over the Tibetan Plateau by UsingmVariational Technique Revised TOVS Data", Chinese Academy of Meteorological Sciences, 1999, vol. 23, No. 6 (English Abstract).

* cited by examiner

METHOD, SYSTEM AND APPARATUS FOR CORRECTING SATELLITE OBSERVATION DATA

CROSS REFERENCE TO RELATED APPLICATION

This patent application claims the benefit and priority of Chinese Patent Application No. 2023110807976, filed with the China National Intellectual Property Administration on Aug. 25, 2023, the disclosure of which is incorporated by reference herein in its entirety as part of the present application.

TECHNICAL FIELD

The present disclosure relates to the technical field of satellite observation, and in particular to a method, system and apparatus for correcting satellite observation data.

BACKGROUND

The accuracy of a numerical model largely depends on accurate description of an initial field on an atmospheric state. Hence, it is of importance to provide an accurate initial field for an atmospheric model through observation data, particularly in a weather-sensitive plateau area. The atmospheric three-dimensional (3D) structure of the Qinghai-Tibet Plateau is associated with precipitation in downstream areas of the westerlies, which has been proved by many researches. Under the influence of the westerlies, the convective system triggered by the Qinghai-Tibet Plateau moves eastward and develops continuously to cause heavy precipitation possibly in the downstream areas. Concerning the precipitation process with different intensities, the accuracy of the numerical model on precipitation simulation or forecasting in the downstream areas can be improved with consideration of radiosonde observation on the plateau.

Due to limitations in original vertical observation time and original observation stations of the Qinghai-Tibet Plateau, the radiosonde observation plays a limited role in model assimilation of the whole plateau. In some studies, an atmospheric profile observed by a satellite is added to the numerical model to improve an accuracy of precipitation forecasting. The existing GIIRS Payload on FY-4A satellite has a spatial resolution of about 16 km, and a temporal resolution of 1 h. This can make up an unevenness of radiosonde stations in limited spatio-temporal distribution. Particularly for some untraversed plateau areas, satellite data are sole high-resolution observation data on the atmospheric state. The satellite data have been widely applied to research and operation of the numerical model. However, some evidences show that the satellite observation data have various errors over data observed by the radiosonde stations. The atmospheric 3D structure is not observed by the satellite directly, but calculated indirectly based on observation on atmospheric radiation. How to temporally and spatially make supplementary observation and correction on the satellite observation data in a wide observation-limited area beyond the radiosonde stations to reduce an error of the satellite observation data and improve an accuracy of the high spatio-temporal resolution satellite observation data has become a technical problem to be solved urgently.

SUMMARY

An objective of the present disclosure is to provide a method, system and apparatus for correcting satellite observation data, to correct high spatio-temporal resolution satellite observation data of a radiosonde observation limited sounding area, reduce an error of the satellite observation data, and improve an accuracy of the satellite observation data. Based on a space-air-ground integrated (SAGIN) vertical sounding solution combined with a satellite, a radiosonde and a microwave radiometer (MWR) mobile platform, the present disclosure realizes networked observation on vertical sounding of the radiosonde observation limited area, changes a limited observation condition of radiosonde observation only available at 08:00 and 20:00 every day in the original service system, and acquires complete high spatio-temporal resolution vertical sounding data of the radiosonde observation limited area in daytime.

To achieve the above objective, the present disclosure provides the following solution.

The present disclosure provides a method for correcting satellite observation data, including the following steps:

constructing, based on large-sample observation data in an early checking stage at a first observation position and first observation time, a first error correction model for correcting movement observation data of a vehicle-mounted microwave radiometer (MWR), the large-sample observation data including observation data in the early checking stage of a radiosonde station at the first observation position and the first observation time and observation data in the early checking stage of the vehicle-mounted MWR, the first observation position being an observation position of the radiosonde station, and the first observation time being observation time of the radiosonde station;

correcting, based on the first error correction model, MWR movement observation data to obtain real-time corrected MWR movement observation data, the MWR movement observation data being observation data obtained by the MWR of a mobile device at different second observation positions and different second observation time on a moving path of the vehicle-mounted MWR in a radiosonde observation limited sounding area, a start and a destination of the MWR in an observation cycle each serving as the first observation position, the second observation positions each being determined based on a spatial resolution observed by the MWR, and the second observation time being determined based on a temporal resolution observed by the MWR;

allowing radiosonde observation data and the real-time corrected movement observation data of the vehicle-mounted MWR to form correction data, and matching the correction data with satellite observation data according to corresponding positions and time of vertical layers to obtain multiple sets of matched data for the vertical layers, the positions including the first observation position and the second observation position, and the time including the first observation time and the second observation time;

constructing, based on the multiple sets of matched data for the vertical layers, a second error correction model for correcting the satellite observation data; and correcting, based on the second error correction model, observation data at third observation positions and different third observation time for the vertical layers on the moving path of the MWR to obtain corrected satellite observation data, the third observation positions each being determined based on a spatial resolution observed by a satellite, and the third observation time being determined based on a temporal resolution observed by the satellite.

Optionally, the constructing, based on large-sample observation data in an early checking stage at a first observation position and first observation time, a first error correction model for correcting movement observation data of a vehicle-mounted MWR specifically includes:
constructing a first to-be-trained model;
calculating, based on large-sample radiosonde observation data at the first observation position and the first observation time, a deviation between the observation data in the early checking stage of the radiosonde at the same first observation position and the same first observation time and the observation data in the early checking stage of the MWR to serve as a first observation data deviation; and
training or fitting the first to-be-trained model based on the first observation data deviation to obtain the first error correction model.

Optionally, the constructing, based on the multiple sets of matched data for the vertical layers, a second error correction model for correcting the satellite observation data specifically includes:
constructing a second to-be-trained model;
calculating a second observation data deviation in each set of the matched data, the second observation data deviation being a deviation between radiosonde observation data at the first observation position and the first observation time and satellite observation data observed by the satellite at the first observation position and the first observation time for each of the vertical layers, or a deviation between the corrected movement observation data of the vehicle-mounted MWR at the second observation position and the second observation time for the vertical layer and satellite observation data observed by the satellite at the second observation position and the second observation time for the vertical layer; and
fitting or iteratively training the second to-be-trained model based on the second observation data deviation to obtain the second error correction model.

The present disclosure provides a system for correcting satellite observation data. The system is applied to the above method, and includes:
a first error correction model construction module configured to construct, based on the large-sample observation data in the early checking stage at the first observation position and the first observation time, the first error correction model for correcting the movement observation data of the vehicle-mounted microwave radiometer (MWR), the large-sample observation data including the observation data in the early checking stage of the radiosonde station at the first observation position and the first observation time and the observation data in the early checking stage of the vehicle-mounted MWR, the first observation position being the observation position of the radiosonde station, and the first observation time being observation time of the radiosonde station;
a first correction module configured to correct, based on the first error correction model, the MWR movement observation data to obtain the real-time corrected MWR movement observation data, the MWR movement observation data being the observation data obtained by the MWR of the mobile device for the different second observation positions and the different observation time on the moving path of the vehicle-mounted MWR in the radiosonde observation limited sounding area, the start and the destination of the MWR in the observation cycle each serving as the first observation position, the second observation positions each being determined based on the spatial resolution observed by the MWR, and the second observation time being determined based on the temporal resolution observed by the MWR;
a matching module configured to allow the radiosonde observation data and the real-time corrected movement observation data of the vehicle-mounted MWR to form the correction data, and match the correction data with the satellite observation data according to the corresponding positions and time for the vertical layers to obtain the multiple sets of matched data for the vertical layers, the positions including the first observation position and the second observation position, and the time including the first observation time and second observation time;
a second error correction model construction module configured to construct, based on the multiple sets of matched data for the vertical layers, the second error correction model for correcting the satellite observation data; and
a second correction module configured to correct, based on the second error correction model, the observation data at the third observation positions and the different third observation time for the vertical layers on the moving path of the MWR to obtain the corrected satellite observation data, the third observation positions each being determined based on the spatial resolution observed by the satellite, and the third observation time being determined based on the temporal resolution observed by the satellite.

The present disclosure provides an electronic device, including a memory, a processor, and a computer program stored on the memory and executable on the processor, where the computer program is executed by the processor to implement the above method.

The present disclosure provides a computer readable storage medium, storing a computer program thereon, where the program is executed by a processor to implement the above method.

The present disclosure provides an apparatus for correcting satellite observation data, including a mobile device, a microwave radiometer (MWR) on the mobile device, and a data processing center, where
the data processing center is connected to the MWR, and the data processing center is further connected to a target radiosonde station and a satellite observation station;
the mobile device is configured to drive the MWR to obtain MWR movement observation data at different second observation positions and different second observation time in a radiosonde observation limited sounding area;
the target radiosonde station is a radiosonde station nearest to the radiosonde observation limited sounding area; second observation positions of the target radiosonde station serve as first observation positions; second observation time of the target radiosonde station serves as first observation time; and the target radiosonde station is configured to acquire radiosonde observation data at the different first observation positions and the different first observation time; and the data processing center is configured to correct satellite observation data with the above method.

Optionally, the mobile device is an unmanned aerial vehicle (UAV) or an unmanned ground vehicle (UGA).

According to specific embodiments provided in the present disclosure, the present disclosure has the following technical effects.

Embodiments of the present disclosure provide a method, system and apparatus for correcting satellite observation data. The method includes the following steps: correcting MWR movement observation data based on radiosonde observation data at a first observation position and first observation time to obtain corrected MWR movement observation data; allowing the radiosonde observation data and the corrected MWR movement observation data to form correction data, and matching the correction data with satellite observation data according to positions and time to obtain multiple sets of matched data, the positions including the first observation position and a second observation position, and the time including the first observation time and second observation time; and correcting the satellite observation data based on the multiple sets of matched data. By acquiring MWR movement observation data of a radiosonde observation limited sounding area, correcting the MWR movement observation data based on corresponding radiosonde observation data, and correcting satellite observation data based on the radiosonde observation data and corrected MWR movement observation data, the present disclosure corrects the satellite observation data of the radiosonde observation limited detection area, reduces an error of the satellite observation data, and makes the satellite observation data more accurate. Based on a SAGIN vertical sounding solution combined with a satellite, a radiosonde and an MWR mobile platform, the present disclosure realizes networked observation on vertical sounding of the radiosonde observation limited area, changes a limited observation condition of radiosonde observation only available at 08:00 and 20:00 every day in the original service system, and acquires complete high spatio-temporal resolution vertical sounding data of the radiosonde observation limited area in daytime. In the embodiments of the present disclosure, the SAGIN vertical sounding solution combined with the satellite, the radiosonde and the MWR mobile platform is applied to networked observation on vertical sounding of an uninhabited area of the Qinghai-Tibet Plateau as well as a radiosonde observation limited area (such as a desert and a wilderness). In the embodiments of the present disclosure, the SAGIN vertical sounding solution combined with the satellite, the radiosonde and the MWR mobile platform is applied to networked observation on vertical sounding of an uninhabited area of the Qinghai-Tibet Plateau as well as a radiosonde observation limited area (such as a desert and a wilderness).

BRIEF DESCRIPTION OF THE DRAWINGS

To describe the technical solutions in embodiments of the present disclosure or in the prior art more clearly, the accompanying drawings required in the embodiments are briefly described below. Apparently, the accompanying drawings in the following description show merely some embodiments of the present disclosure, and other drawings can be derived from these accompanying drawings by those of ordinary skill in the art without creative efforts.

DETAILED DESCRIPTION OF THE EMBODIMENTS

The technical solutions in the embodiments of the present disclosure are described clearly and completely below with reference to the accompanying drawings in the embodiments of the present disclosure. Apparently, the described embodiments are merely some rather than all of the embodiments of the present disclosure. All other embodiments obtained by those skilled in the art based on the embodiments of the present disclosure without creative efforts shall fall within the protection scope of the present disclosure.

An objective of the present disclosure is to provide a method, system and apparatus for correcting satellite observation data, to correct high spatio-temporal resolution satellite observation data of a radiosonde observation limited sounding area, reduce an error of the satellite observation data, and improve an accuracy of the satellite observation data. Based on a SAGIN vertical sounding solution combined with a satellite, a radiosonde and an MWR mobile platform, the present disclosure realizes networked observation on vertical sounding of the radiosonde observation limited area, changes a limited observation condition of radiosonde observation only available at 08:00 and 20:00 every day in the original service system, and acquires complete high spatio-temporal resolution vertical sounding data of the radiosonde observation limited area in daytime.

In order to make the above objective, features and advantages of the present disclosure clearer and more comprehensible, the present disclosure will be further described in detail below in combination with accompanying drawings and particular implementation modes.

With fine development of the numerical model, high requirements are imposed on observation data. High-accuracy and high-resolution satellite data are of importance to supplementation of atmospheric observation. In combination with satellite data, radiosonde data and MWR data, a variational method can provide a high-resolution accurate dataset for dynamic and thermal studies on plateaus, and makes the numerical model more accurate for precipitation forecasting. The variational method requires accurate ground-based observation. The observation of a radiosonde station and movement observation of an MWR can meet requirements of the variational method. Compared with a radiosonde, the MWR can provide continuous observation on an atmospheric vertical profile. In combination with continuous observation of the geosynchronous satellite, continuous, high-resolution and accurate observation on an atmospheric vertical structure of an uninhabited plateau area can be realized theoretically.

However, in the face of evil living and production conditions of the plateau, it is impossible to acquire normal data in site in the uninhabited area.

In view of this, with an unmanned vehicle-mounted atmospheric vertical sounding system, an unmanned mobile radiosonde platform is designed to realize normal daytime sounding on the atmospheric vertical structure of the uninhabited plateau area. The vehicle sets out from a radiosonde station at 08:00, and travels to a depth direction of the convection area of the plateau, thereby forming a near south-north or east-west dynamic sounding profile of the atmospheric vertical structure. The vehicle goes back to the original radiosonde station at 20:00 in the evening. Balloon launching time of the radiosonde station is synchronized when the vehicle sets out and goes back, so as to make a comparison between the MWR and the radiosonde in the unmanned mobile radiosonde platform, and control data quality. Compared with the original radiosonde station where observation is only performed at 08:00 and 20:00, the present disclosure provides more abundant sounding data in daytime, including continuous sounding data at a strong convection period (namely noontime). The sounding area in the depth direction is a forecasting sensitive area and a convection development source area of the plateau numerical model. The present disclosure solves the problem of full daytime monitoring on the uninhabited plateau area, and especially solves the problem that a strong signal of the atmospheric vertical structure in the strong convection period of the convection source plateau area at noon is obtained difficultly. Particularly, the present disclosure improves the accuracy of meteorological forecasting, and achieves positive social benefits and obvious economic benefits.

Embodiment 1

Figure 1:
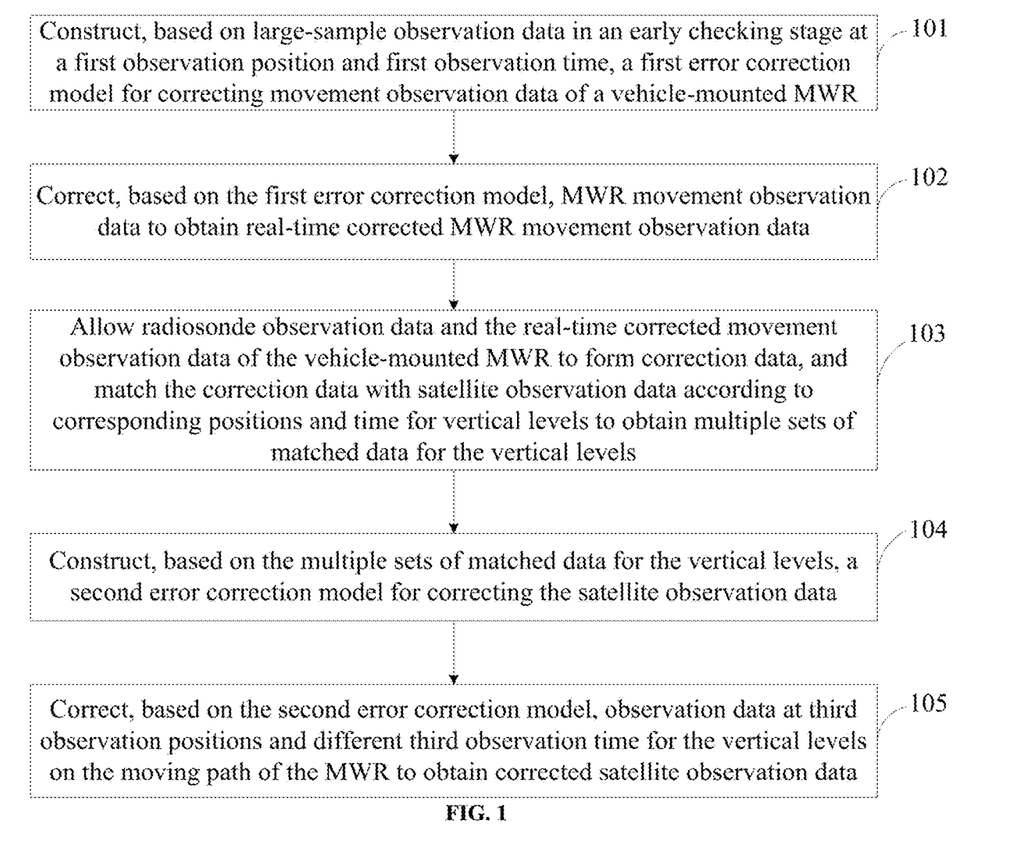
FIG. 1 is a flow chart of a method for correcting satellite observation data according to an embodiment of the present disclosure.

The embodiment of the present disclosure provides a method for correcting satellite observation data, including the following steps.

Step 101: A first error correction model for correcting movement observation data of a vehicle-mounted MWR is constructed based on large-sample observation data in an early checking stage at a first observation position and first observation time, the large-sample observation data including observation data in the early checking stage of a radiosonde station at the first observation position and the first observation time and observation data in the early checking stage of the vehicle-mounted MWR, the first observation position being an observation position of the radiosonde station, and the first observation time being observation time of the radiosonde station.

In Step 101, based on a temperature, a humidity and vertical observation data of a radiosonde (radiosonde observation data) at 08:00 and 20:00, the present disclosure constructs a correlation model for dynamic observation data of an unmanned vehicle-mounted atmospheric vertical sounding system (the MWR has a sounding height of −10 km under the ground) and data of the radiosonde station, thereby obtaining corrected dynamic observation data of the unmanned vehicle-mounted atmospheric vertical sounding system, namely corrected MWR movement observation data.

Step 102: MWR movement observation data is corrected based on the first error correction model to obtain real-time corrected MWR movement observation data, the MWR movement observation data being observation data obtained by the MWR of a mobile device at different second observation positions and different second observation time on a moving path of the vehicle-mounted MWR in a radiosonde observation limited sounding area, a start and a destination of the MWR in an observation cycle each serving as the first observation position, the second observation positions each being determined based on a spatial resolution observed by the MWR, and the second observation time being determined based on a temporal resolution observed by the MWR.

Step 103: Radiosonde observation data and the real-time corrected movement observation data of the vehicle-mounted MWR are allowed to form correction data, and the correction data is matched with satellite observation data according to corresponding positions and time of vertical layers to obtain multiple sets of matched data for the vertical layers, the positions including the first observation position and the second observation position, and the time including the first observation time and the second observation time.

In Step 103, the present disclosure resamples data of FY4A and FY4B geosynchronous satellites as standard data (satellite observation data) at a 0.1 grid and a 1 h resolution based on an original spatio-temporal resolution of satellite data, and matches the standard data with radiosonde data and MWR data temporally and spatially.

Step 104: A second error correction model for correcting the satellite observation data is constructed based on the multiple sets of matched data for the vertical layers.

Step 105: Observation data at third observation positions and different third observation time for the vertical layers on the moving path of the MWR is corrected based on the second error correction model to obtain corrected satellite observation data, the third observation positions each being determined based on a spatial resolution observed by a satellite, and the third observation time being determined based on a temporal resolution observed by the satellite.

In Step 104 and Step 105, the present disclosure performs variational correction on FY4-series data based on the radiosonde station at 08:00 and 20:00, namely corrects the satellite observation data based on the radiosonde observation data at the first observation position and the first observation time. The variational correction method is to construct a generic function given by Eq. (1). Through a Euler equation (Eq. (2)) of the generic function, an error field is iteratively solved, thereby correcting the satellite data.

$$J[U(x, y)] = \int\int_G F\left(x, y, U, \frac{\partial U}{\partial x}, \frac{\partial U}{\partial y}\right) dxdy \qquad (1)$$

$$Fu - \left(\frac{\partial}{\partial x} Fu_x + \frac{\partial}{\partial y} Fu_y\right) = 0 \qquad (2)$$

Where, J[U(x,y)] represents the constructed generic function, and $\iint_G F$ $$\left(x, y, U, \frac{\partial U}{\partial x}, \frac{\partial U}{\partial y}\right)$$

indicates that the generic function is associated with a longitude x, a latitude y, a temperature profile U and $$\frac{\partial U}{\partial x}, \frac{\partial U}{\partial y}. \qquad \text{Eq. (1)}$$

satisfies the Euler Eq. (2), Fu represents a partial derivative of F to U, $Fu_x$ represents a partial derivative of the F function to $u_x$, and $u_x$ is given by $$\frac{\partial U}{\partial x}.$$

Assuming that the atmospheric profile of the satellite remote-sensing product, namely the satellite observation data, is set as $P_{FY}(I,J)$, the corresponding radiosonde observation data or corrected MWR movement observation data is $P_{obs}(I,J)$, and a discrete error field is $Cr(I,J)$, Eq. (3) is obtained.

$$\check{C}r(I, J) = P_{obs}(I, J) - P_{FY}(I, J) \tag{3}$$

The discrete error field is promoted to a continuous satellite surface to obtain an error field function $Cr(x, y)$ given by Eq. (4), and a minimum of a loss function J of the new error field is solved by an iterative method.

$$J^* = \int\int_D (Cr - \check{C}r)^2 dx dy \to \min \tag{4}$$

Concerning the variational problem, the function J* can be constructed as:

$$J^* = \int\int \left[(Cr - \check{C}r)^2 + \lambda\left[\left(\frac{\partial Cr}{\partial x}\right)^2 + \left(\frac{\partial Cr}{\partial y}\right)^2\right]\right] dx\, dy \tag{5}$$

$\lambda$ is a restraint coefficient, and the above eq. can be rewritten as the following difference scheme:

$$\delta J = \sum\sum \left[(Cr - \check{C}r)^2 + \lambda\left[\left(\frac{\partial Cr}{\partial x}\right)^2 + \left(\frac{\partial Cr}{\partial y}\right)^2\right]\right] = 0 \tag{6}$$

The corresponding Euler equation is given by:

$$\check{C}r(I, J) = P_{obs}(I, J) - P_{FY}(I, J) \tag{7}$$

A numerical solution of the above equation is obtained by iterative expansion, and a corrected precipitation field is obtained:

$$P(x, v) = P_{FY}(x, y) + Cr(x, y) \tag{8}$$

Through the 2D variational method and in combination with dynamic observation data observed by the radiosonde station and the mobile platform in atmospheric vertical sounding, the temperature, the humidity and the vertical observation data in the satellite data (FY4A and FY4B geosynchronous satellites) are corrected variationally at a high spatio-temporal resolution. At 08:00 and 20:00, data of the remote sensing satellite, the radiosonde station and the MWR are corrected and fused. At time other than 08:00 and 20:00, data of the remote sensing satellite and the MWR are corrected and fused. Therefore, high spatio-temporal resolution and high-accuracy variational analysis data for the atmospheric vertical structure of the uninhabited plateau area are obtained.

In the present disclosure, the high spatio-temporal resolution data are taken as an initial field of rolling forecasting in four-dimensional (4D) or three-dimensional (3D) assimilation of the numerical forecasting model. At present, there has been a weather research and forecasting (WRF) model with a version 4.3.0. In China, a global/areaal assimilation and prediction system (GRAPES) model with a version meso-V5.0 is provided. In the United States, a global forecast system (GFS) model developed by the National Centers for Environmental Prediction (NCEP) is provided. In July 2017, the GFS model is upgraded to the new version (GFS-Para). The MWR can provide high vertical resolution observation for the model within ten kilometers near the stratum, such that the vertical simulation resolution of the model is greatly improved. With the various numerical models, thermal and dynamic structures for the atmosphere of the plateau can be captured more accurately.

Embodiment 2

Figure 2:
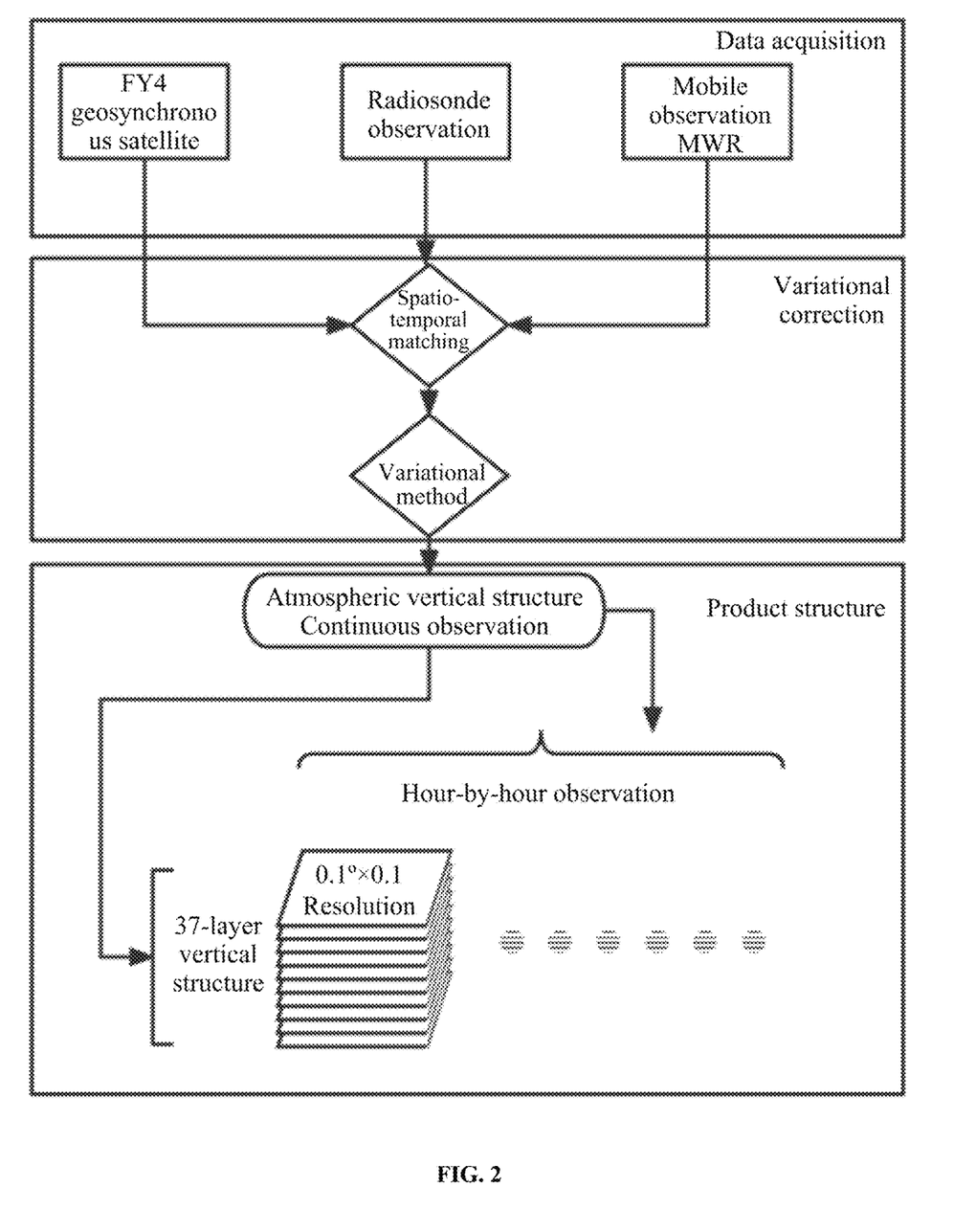
FIG. 2 is a schematic diagram of a method for correcting satellite observation data according to an embodiment of the present disclosure.

Embodiment 2 of the present disclosure provides a system for correcting satellite observation data. The system is applied to the method in Embodiment 1. The system includes a first error correction model construction module, a first correction module, a matching module, a second error correction model construction module, and a second correction module.

The first error correction model construction module is configured to construct, based on large-sample observation data in an early checking stage at a first observation position and first observation time, a first error correction model for correcting movement observation data of a vehicle-mounted MWR. The large-sample observation data includes observation data in the early checking stage of a radiosonde station at the first observation position and the first observation time and observation data in the early checking stage of the vehicle-mounted MWR. The first observation position is an observation position of the radiosonde station. The first observation time is observation time of the radiosonde station.

The first correction module is configured to correct MWR movement observation data based on the first error correction model to obtain real-time corrected MWR movement observation data. The MWR movement observation data is observation data obtained by the MWR of a mobile device at different second observation positions and different second observation time on a moving path of the vehicle-mounted MWR in a radiosonde observation limited sounding area. A start and a destination of the MWR in an observation cycle each serve as the first observation position. The second observation positions each are determined based on a spatial resolution observed by the MWR. The second observation time is determined based on a temporal resolution observed by the MWR.

The matching module is configured to allow radiosonde observation data and the real-time corrected movement observation data of the vehicle-mounted MWR to form correction data, and match the correction data with satellite observation data according to corresponding positions and time of vertical layers to obtain multiple sets of matched data for the vertical layers. The positions include the first observation position and the second observation position. The time includes the first observation time and the second observation time.

The second error correction model construction module is configured to construct, based on the multiple sets of matched data for the vertical layers, a second error correction model for correcting the satellite observation data.

The second correction module is configured to correct, based on the second error correction model, observation data at third observation positions and different third observation time for the vertical layers on the moving path of the MWR to obtain corrected satellite observation data. The third observation positions each are determined based on a spatial resolution observed by a satellite. The third observation time is determined based on a temporal resolution observed by the satellite.

Embodiment 3

Embodiment 3 of the present disclosure provides an electronic device, including a memory, a processor, and a computer program stored in the memory and executable on the processor. The computer program is executed by the processor to implement the method in Embodiment 1.

Embodiment 4

Embodiment 4 of the present disclosure provides a computer-readable storage medium, storing a computer program thereon. The program is executed by a processor to implement the method in Embodiment 1.

Embodiment 5

Figure 3:
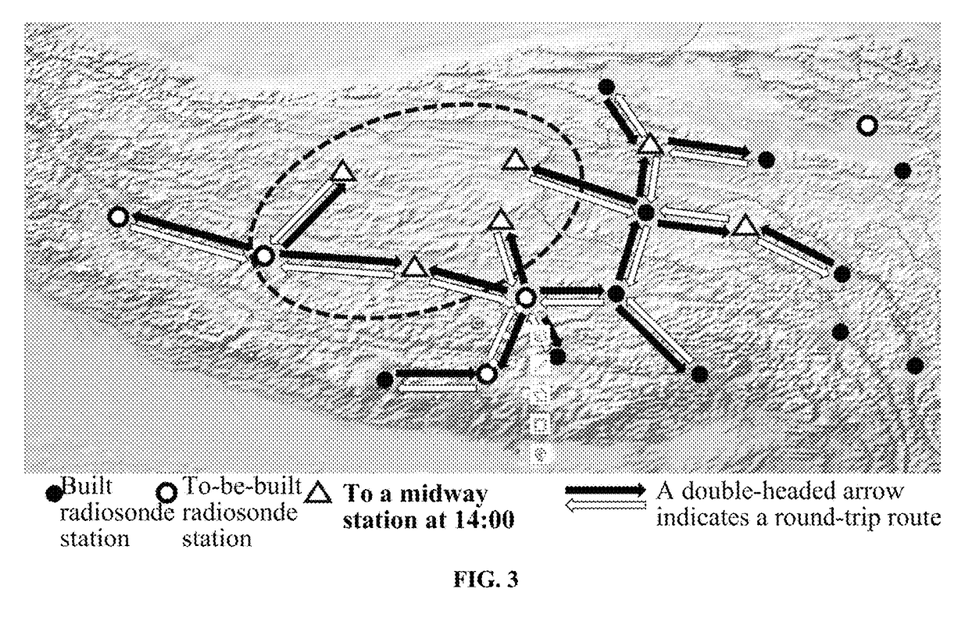
FIG. 3 is a structural diagram of an apparatus for correcting satellite observation data according to an embodiment of the present disclosure.

Embodiment 5 of the present disclosure provides an apparatus for correcting satellite observation data. The apparatus includes a mobile device, an MWR on the mobile device, and a data processing center. The data processing center is connected to the MWR. The data processing center is further connected to a target radiosonde station and a satellite observation station. The mobile device is configured to drive the MWR to obtain MWR movement observation data at different second observation positions and different second observation time in a radiosonde observation limited sounding area. The target radiosonde station is a radiosonde station nearest to the radiosonde observation limited sounding area. Second observation positions of the target radiosonde station serve as first observation positions. Second observation time of the target radiosonde station serves as first observation time. The target radiosonde station is configured to acquire radiosonde observation data at the different first observation positions and the different first observation time. The data processing center is configured to correct satellite observation data with the method in Embodiment 1.

In the embodiment of the present disclosure, the mobile device is an unmanned aerial vehicle (UAV) or an unmanned ground vehicle (UGA). Exemplarily, when the mobile device is the UGA, the MWR is mounted on the UGA. A cabinet is provided on the UGA. The cabinet can meet fixed mounting and normal working requirements of the MWR (a radiating surface is not shielded), mounting and fixation requirements of a vehicle sensor (a laser radar, a camera, a directional antenna, etc.), and normal working requirements of a vehicle sensing module. Through the cabinet, the MWR is fixedly provided on the vehicle and protected.

In the embodiment of the present disclosure, with a UGA as a driving domain, and a mobile atmospheric vertical sounding system (such as the MWR) as a business domain, a dynamic meteorological monitoring system for an atmospheric vertical structure is constructed. The novel atmospheric unmanned vehicle-mounted vertical sounding platform and the optimized dynamic sounding layout thereof can effectively solve the problem of difficult construction of a manned radiosonde station in the uninhabited plateau area, and solves the realistic problem that high-altitude sounding data of the atmospheric vertical structure in the uninhabited area cannot be acquired.

For the sake of daytime sounding on the atmospheric vertical structure in the uninhabited plateau area (strong convection area), in combination with a meteorological monitoring device and a driverless technology, the atmospheric vertical mobile sounding platform can be constructed in an unmanned or manned manner. The platform can realize the sounding according to a specified route, a specified speed and specified time, and can be operated remotely. This minimizes personnel participation in site, and makes an unmanned atmospheric vertical mobile meteorological monitoring platform come true.

In order to dynamically monitor the atmospheric vertical structure, and particularly to compare vertical sounding data of the MWR and the radiosonde station or establish the correction module, and implement data quality control, the existing radiosonde station (target radiosonde station) at the periphery of the uninhabited plateau area is selected as a base of the mobile sounding platform. The route comes from the existing radiosonde station at the periphery of the uninhabited plateau area at 08:00 (as shown in FIG. 3, the radiosonde station launches a balloon for a first time at 20:00 every day), and travels to a "depth direction" of the strong convection area of the uninhabited plateau area. The vertical sounding process of the dynamically moving MWR form a sounding profile "data wall" of the near south-north or east-west dynamic atmospheric vertical structure. The mobile vehicle reaching the strong convection area of the uninhabited plateau area goes back from a relay station at 14:00. By this time, the convection is strong, and the mobile sounding platform can obtain one of key assimilation information for the initial field of the numerical forecasting model (noontime sounding data at strong convection time in the convection source area). At 20:00 (the balloon is launched from the radiosonde station for a second time every day) in the evening, the mobile vehicle goes back to the original radiosonde station, as shown in FIG. 3.

As shown in FIG. 3, based on the upper-air meteorological station (such as the built radiosonde station or the to-be-built radiosonde station in FIG. 3), the vehicle sets out at 08:00 in the morning (along a solid arrow in FIG. 3), travels to the uninhabited area and reaches a midway station at 14:00 in the afternoon (The vehicle sets out at 08:00 in the morning, and is driven for 6 h to 14:00 in the afternoon The time exactly covers the strong climate changing period). Thereafter, the unmanned vehicle goes back (along a hollow arrow direction in FIG. 3). The unmanned vehicle has a designed speed of 50 km/h, and is driven for 6 h respectively in the morning and afternoon. The whole one-way distance is 300 km.

In combination with the satellite data, the radiosonde data and the mobile observation data, the present disclosure provides a high spatio-temporal resolution and reliable dataset for the atmospheric vertical structure of the uninhabited plateau area. Through the variational method, the quality of the corrected satellite data is improved. Based on the generic function and with reference to the radiosonde observation and the MWR observation, the variational method is to gradually iterate the constructed error surface of the satellite data to a true surface through the Euler equation. This makes the satellite data, the radiosonde data and the MWR data consistent better. While keeping the high spatio-temporal resolution of the satellite data, the method has the characteristic of the high accuracy of the radiosonde data and the MWR data. The MWR observation is also continuous. At a period without the radiosonde observation, the MWR observation provides an important reference for the atmospheric vertical structure in the variational method, thereby realizing continuous observation for the uninhabited plateau area.

Figure 4A:
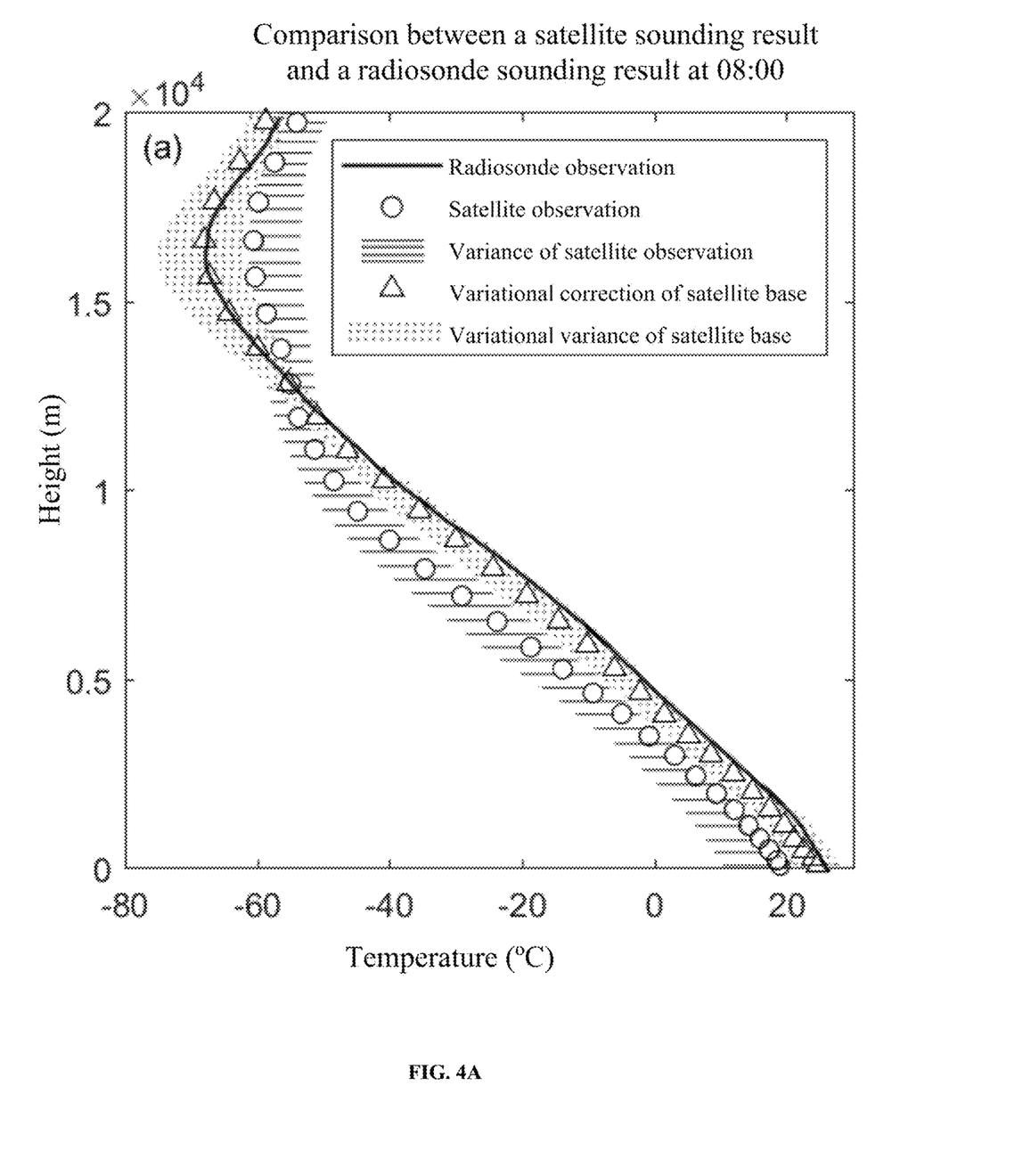
FIGS. 4A-B illustrate an effect comparison according to an embodiment of the present disclosure.
Figure 4B:
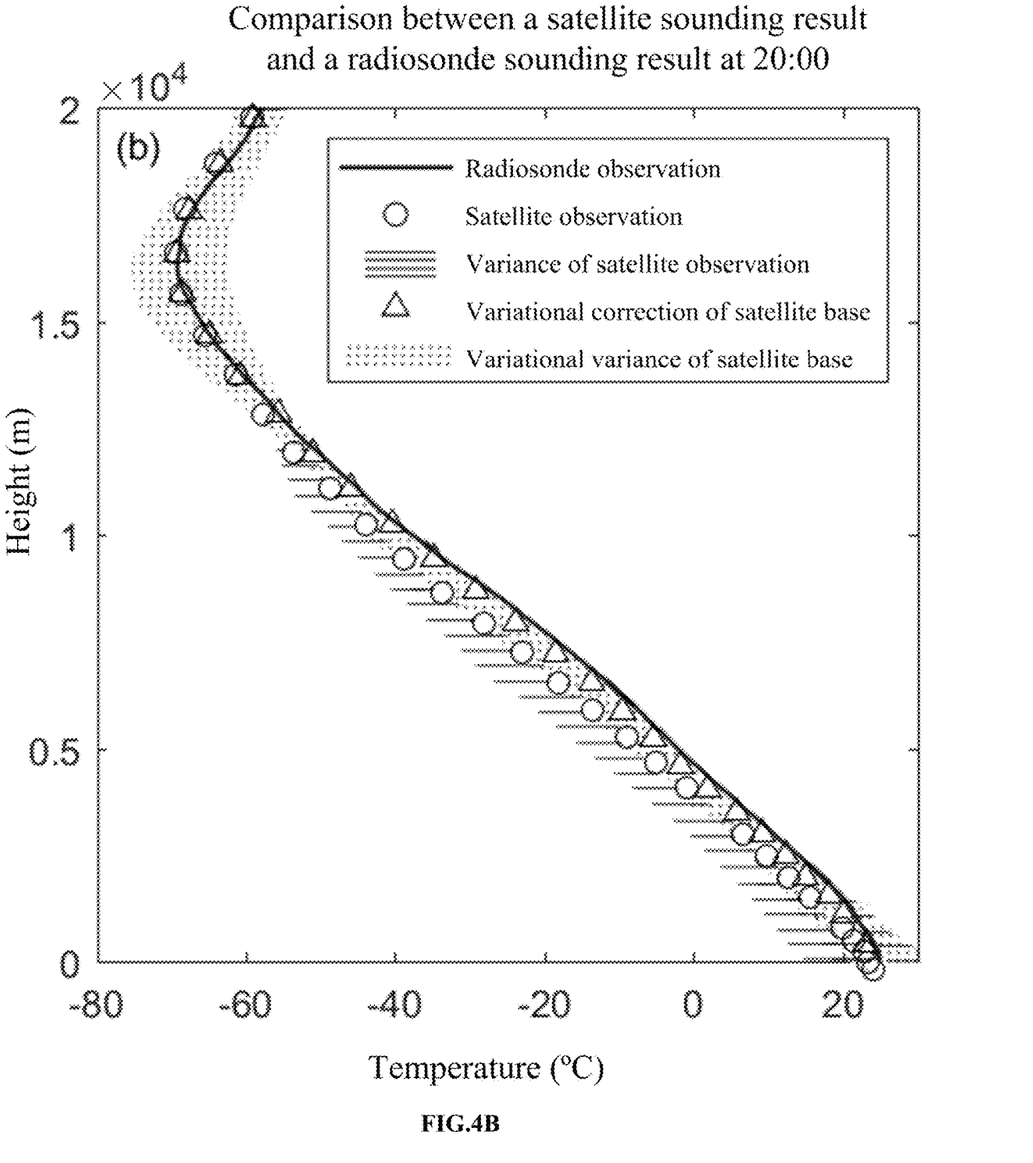

10% of radiosonde samples and mobile observation samples are selected for crosschecking. As shown in FIGS. 4A-B, FIG. 4A illustrates a comparison between a satellite sounding result and a radiosonde sounding result at 00:00, and FIG. 4B illustrates a comparison between a satellite sounding result and a radiosonde sounding result at 20:00. This indicates that the quality of the corrected data is obviously improved with the variational method. The circular area refers to original satellite data, the triangular area refers to corrected satellite data, and the black line refers to radiosonde observation and observation of the vehicle-mounted MWR. It can be seen that the triangular area is closer to the black line than the circular area, and indicated that the corrected result is closer to the radiosonde observation and the observation of the vehicle-mounted MWR. The above comparison further indicates that the variational method is very effective to correct the satellite data in combination with the radiosonde observation and the MWR observation.

Based on the technical solutions in the above embodiments, the present disclosure has the following beneficial effects:

The present disclosure solves the problem of full daytime monitoring on the uninhabited plateau area, and especially solves the problem that a strong signal of the atmospheric vertical structure in the strong convection period of the plateau convective source area at noon is obtained difficultly. Particularly, the present disclosure improves the accuracy of meteorological forecasting, and achieves positive social benefits and obvious economic benefits.

Each embodiment in the description is described in a progressive mode, each embodiment focuses on differences from other embodiments, and references can be made to each other for the same and similar parts between embodiments. Since the system disclosed in an embodiment corresponds to the method disclosed in an embodiment, the description is relatively simple, and for related contents, references can be made to the description of the method.

Particular examples are used herein for illustration of principles and implementation modes of the present disclosure. The descriptions of the above embodiments are merely used for assisting in understanding the method of the present disclosure and its core ideas. In addition, those of ordinary skill in the art can make various modifications in terms of particular implementation modes and the scope of application in accordance with the ideas of the present disclosure. In conclusion, the content of the description shall not be construed as limitations to the present disclosure.

The invention claimed is:

1. An apparatus for correcting satellite observation data, comprising a mobile device, a microwave radiometer (MWR) on the mobile device, and a data processing center, wherein
the data processing center is connected to the MWR, and the data processing center is further connected to a target radiosonde station and a satellite observation station;
the mobile device is configured to drive the MWR to obtain MWR movement observation data at different second observation positions and different second observation time in a radiosonde observation limited sounding area;
the target radiosonde station is a radiosonde station nearest to the radiosonde observation limited sounding area; second observation positions of the target radiosonde station serve as first observation positions; second observation time of the target radiosonde station serves as first observation time; and the target radiosonde station is configured to acquire radiosonde observation data at the different first observation positions and the different first observation time; and
the data processing center is configured to perform the following steps:
constructing, based on large-sample observation data in an early checking stage at a first observation position and first observation time, a first error correction model for correcting movement observation data of a vehicle-mounted microwave radiometer (MWR), the large-sample observation data comprising observation data in the early checking stage of a radiosonde station at the first observation position and the first observation time and observation data in the early checking stage of the vehicle-mounted MWR, the first observation position being an observation position of the radiosonde station, and the first observation time being observation time of the radiosonde station; based on radiosonde observation data at 08:00 and 20:00, constructing a correlation model for dynamic observation data of the vehicle-mounted MWR and radiosonde station data;
correcting, based on the first error correction model, MWR movement observation data to obtain real-time corrected MWR movement observation data, the MWR movement observation data being observation data obtained by the MWR of a mobile device at different second observation positions and different second observation time on a moving path of the vehicle-mounted MWR in a radiosonde observation limited sounding area, a start and a destination of the MWR in an observation cycle each serving as the first observation position, the second observation positions each being determined based on a spatial resolution observed by the MWR, and the second observation time being determined based on a temporal resolution observed by the MWR;
allowing radiosonde observation data and the real-time corrected movement observation data of the vehicle-mounted MWR to form correction data, and matching the correction data with satellite observation data according to corresponding positions and time of vertical layers to obtain multiple sets of matched data for the vertical layers, the positions comprising the first observation position and the second observation position, and the time comprising the first observation time and the second observation time;
constructing, based on the multiple sets of matched data for the vertical layers, a second error correction model for correcting the satellite observation data; and
correcting, based on the second error correction model, observation data at third observation positions and different third observation time for the vertical layers on the moving path of the MWR to obtain corrected satellite observation data, the third observation positions each being determined based on a spatial resolution observed by a satellite, and the third observation time being determined based on a temporal resolution observed by the satellite;

wherein the constructing, based on the multiple sets of matched data for the vertical layers, a second error correction model for correcting the satellite observation data specifically comprises:

constructing a second to-be-trained model;

calculating a second observation data deviation in each set of the matched data, the second observation data deviation being a deviation between radiosonde observation data at the first observation position and the first observation time and satellite observation data observed by the satellite at the first observation position and the first observation time for each of the vertical layers, or a deviation between the corrected movement observation data of the vehicle-mounted MWR at the second observation position and the second observation time for the vertical layer and satellite observation data observed by the satellite at the second observation position and the second observation time for the vertical layer; and fitting or iteratively training the second to-be-trained model based on the second observation data deviation to obtain the second error correction model;

wherein the mobile device is an unmanned ground vehicle (UGV).

2. The apparatus for correcting satellite observation data according to claim 1;

wherein the constructing, based on large-sample observation data in an early checking stage at a first observation position and first observation time, a first error correction model for correcting movement observation data of a vehicle-mounted MWR specifically comprises:

constructing a first to-be-trained model;

calculating, based on large-sample radiosonde observation data at the first observation position and the first observation time, a deviation between the observation data in the early checking stage of the radiosonde at the same first observation position and the same first observation time and the observation data in the early checking stage of the MWR to serve as a first observation data deviation; and training or fitting the first to-be-trained model based on the first observation data deviation to obtain the first error correction model.

* * * * *